United States Patent [19]

Hershberger et al.

[11] Patent Number: 4,829,432
[45] Date of Patent: May 9, 1989

[54] APPARATUS FOR SHIELDING AN ELECTRICAL CIRCUIT FROM ELECTROMAGNETIC INTERFERENCE

[75] Inventors: Marc Hershberger; Carl Stevens; Peter Ozug, all of Rochester, N.Y.

[73] Assignee: Eastman Kodak Company, Rochester, N.Y.

[21] Appl. No.: 138,276

[22] Filed: Dec. 28, 1987

[51] Int. Cl.⁴ ............................................. H05K 9/00
[52] U.S. Cl. .................................. 361/424; 174/35 R; 174/51; 361/399
[58] Field of Search ........... 174/35 R, 35 MS, 35 FC, 174/51; 361/212, 220, 393–395, 399, 422, 424

[56] References Cited

U.S. PATENT DOCUMENTS

| | | | |
|---|---|---|---|
| 3,407,261 | 10/1968 | Donath et al. | 361/424 |
| 4,211,324 | 7/1980 | Ohlbach | 206/328 |
| 4,370,515 | 1/1983 | Donaldson | 361/424 |
| 4,386,388 | 5/1983 | Beun | 361/399 |
| 4,388,132 | 6/1983 | Hoge et al. | 156/153 |
| 4,404,615 | 9/1983 | Dep | 361/212 |
| 4,480,747 | 11/1984 | Kazor et al. | 206/334 |
| 4,510,345 | 4/1985 | Costa et al. | 174/35 |
| 4,528,222 | 7/1985 | Rzepecki et al. | 428/35 |
| 4,542,076 | 9/1985 | Bednarz et al. | 428/624 |
| 4,557,379 | 12/1985 | Lane et al. | 206/328 |
| 4,567,317 | 1/1986 | Ehrlich et al. | 174/35 |
| 4,578,310 | 3/1986 | Hatfield | 428/334 |
| 4,590,534 | 5/1986 | Akamatsu et al. | 361/212 |
| 4,609,104 | 9/1986 | Kasper et al. | 206/334 |
| 4,647,714 | 3/1987 | Goto | 174/36 |
| 4,658,334 | 4/1987 | McSparran et al. | 361/415 |
| 4,661,888 | 4/1987 | Jewell et al. | 361/424 |
| 4,663,240 | 5/1987 | Hajdu et al. | 428/545 |
| 4,717,990 | 1/1988 | Tugcu | 361/424 |
| 4,737,597 | 4/1988 | Tomiya et al. | 174/35 R |

FOREIGN PATENT DOCUMENTS 3313967 10/1984 Fed. Rep. of Germany .... 174/35 R
2101811 1/1983 United Kingdom .

Primary Examiner—A. D. Pellinen
Assistant Examiner—Gregory P. Thompson
Attorney, Agent, or Firm—William F. Noval

[57] ABSTRACT

Apparatus is disclosed for shielding an electric circuit, mounted on a circuit board, from electromagnetic interference (EMI). The electrical circuit is mounted on one side of a circuit board. A conductive layer on the other side of the circuit board functions as a ground plane. An enclosure of insulating material is open on one side and has an inside surface of electrically conductive material. The circuit board and enclosure are joined together so that the electrical circuit on the circuit board is substantially completely surrounded by the electrically conductive material on the inside surface of the enclosure and by the ground plane of the circuit board. Thus, there is provided an effective EMI shield for the electrical circuit.

2 Claims, 2 Drawing Sheets

APPARATUS FOR SHIELDING AN ELECTRICAL CIRCUIT FROM ELECTROMAGNETIC INTERFERENCE

BACKGROUND OF THE INVENTION

This invention relates in general to electrical apparatus. More particularly, this invention relates to apparatus for shielding, an electrical circuit mounted on a circuit board, from electromagnetic interference.

Modern electrical equipment include many electrical circuits which are sensitive to external electromagnetic interference and radio frequency interference. This interference may originate from internal sources within the equipment or from external interference sources, such as power lines. Such interference can cause degradation or complete loss of important signals, rendering the electrical equipment inefficient or inoperative. Furthermore, governmental regulations (such as those of the Federal Communications Commission (FCC)), require that the levels of electromagnetic interference and radio frequency interference signals, produced by electrical circuits, be maintained below a predetermined level, so that such signals do not interfere with other electrical circuitry and equipment.

It is thus desirable to provide a shield (1) to protect electrical circuitry which is sensitive to electromagnetic intereference and (2) to contain EMI internally generated by electrical circuitry which produces electromagnetic interference. Where the electrical circuit to be shielded is provided on a circuit board, it has been proposed, in U.S. Pat. Nos. 4,386,388 and 4,661,888, to mount the circuit board in a metal enclosure. However, metallic enclosures are expensive, and are not suitable in applications where the external surface of the enclosure needs to be non-conductive. Thus, an additional non-conductive member surrounding the metallic enclosure is required when all-metal enclosures are used as a shield. It has also been proposed, in U.S. Pat. No. 4,567,317, to provide an enclosure of non-conductive material which has an internal surface of conductive material. As disclosed in the latter patent, the enclosure includes a base member and a complementary cover member, which are fitted together, to provide an enclosure for shielding a separate circuit board mounted within the enclosure. This technique is disadvantageous because of the expense and complexity of using two interfitting shield members, in addition to the circuit board to be shielded.

There is thus a need in the art, for apparatus for shielding, an electrical circuit mounted on a circuit board, from electromagnetic interference, which is simple, inexpensive and effective.

SUMMARY OF THE INVENTION

According to the present invention, there is provided apparatus for shielding an electrical circuit from electromagnetic interference, which fulfills this need in the art. According to an aspect of the present invention, an electrical circuit is mounted on one side of a circuit board. On the other side of the circuit board is mounted an electrically conductive ground plane. An electrically insulating enclosure has an open side and has an inside layer which is an electrically conductive shielding layer. The enclosure and the circuit board are interfitted so that the ground plane of the circuit board and the inner conductive layer of the enclosure, substantially completely surround the electrical circuit so as to effectively shield the circuit from electromagnetic interference.

According to an aspect of the invention, means are provided for electrically connecting the ground plane and the shielding layer. Thus, the electrical circuit is substantially completely enclosed in a grounded conductive shield. This effectively prevents electromagnetic interference from radiating beyond the enclosure or from penetrating the enclosure to interfere with the electrical circuit.

According to another aspect of the invention, the ground plane of the circuit board forms one side of the shielding enclosure. Thus, the number of components needed for electromagnetic interference shielding are reduced, thus reducing cost and complexity while providing effective EMI shielding.

DESCRIPTION OF THE DRAWINGS

In the detailed description of the invention presented below, reference is made to the accompanying drawings in which like elements are numbered with like members.

DESCRIPTION OF THE PREFERRED EMBODIMENT

Figure 3:
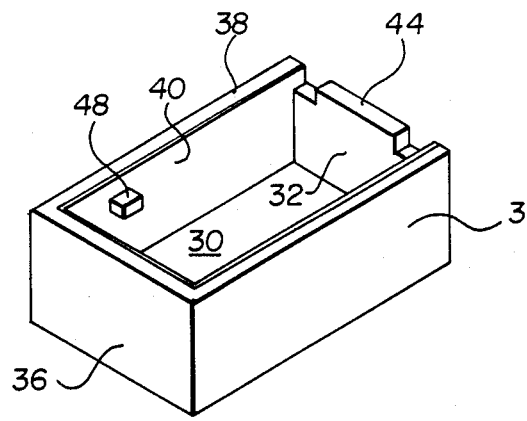
FIG. 3 is a perspective view of the enclosure of the embodiment of FIG. 1.
Figure 4:
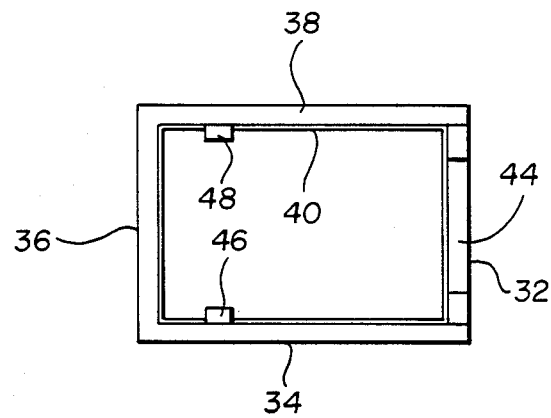
FIG. 4 is a plan view of the enclosure of FIG. 3.

Referring now to the Figures, there is shown a preferred embodiment of the present invention. As shown in FIGS. 1-5, a circuit board 10 has a side 12 provided with an electrical circuit 14 which is to be shielded from electromagnetic interference (EMI) signals. Electrical circuit 14 includes electrical grounding conductor 16 to conductor 18, and electrical components 20 and 22. Components 20 and 22 are surface mounted on side 12 and electrically connected to conductors 16 and 18. The opposite side 23 of board 10, is provided with an electrically conductive ground plane 24. Conductor 16 is connected through board 10 to ground plane 24 by means of conductive plug 26. Board 10 is interfitted with a box-like enclosure 28 of generally rectangular configuration. As shown in FIGS. 3 and 4, enclosure 28 has a bottom wall 30 and contiguous side walls 32, 34, 36 and 38.

Enclosure 28 is preferably of molded plastic insulating material and has an inner layer 40 of electrically conductive material, such as plated copper. Layer 40 covers the inner surfaces of walls 30, 32, 34, 36 and 38 of enclosure 28. Circuit board 10 is dimensioned to fit inside of enclosure 28 so that ground plane 24 is adjacent to conductive layer 40. Thus, electrical circuit 14 is substantially completely surrounded by layer 40 and plane 24.

Figure 1:
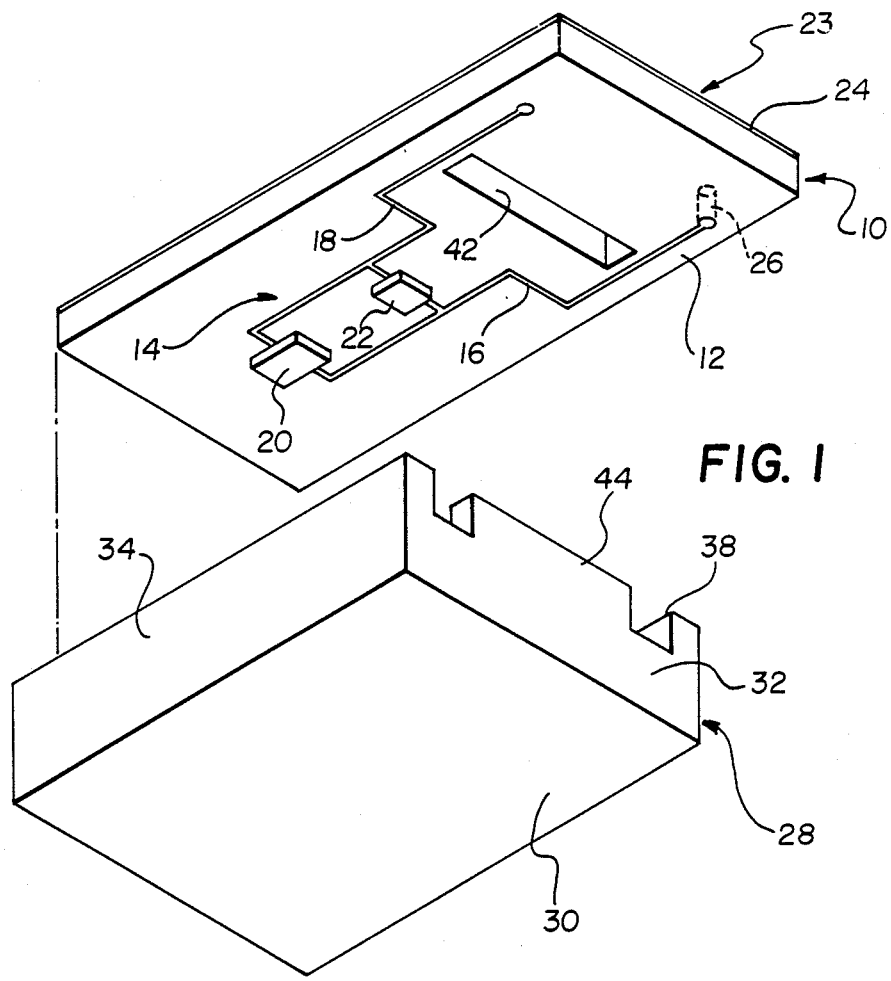
FIG. 1 is a perspective view of an embodiment of the present invention showing the components separated.
Figure 2:
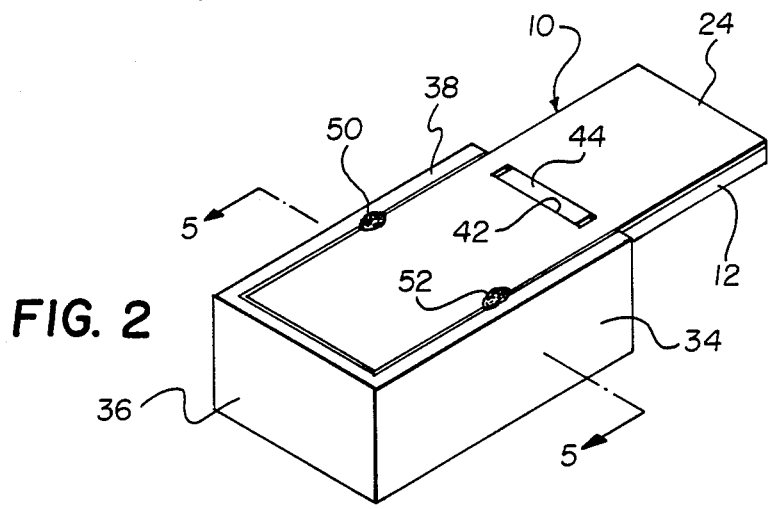
FIG. 2 is a perspective view of the embodiment of FIG. 1 showing the components joined.

Circuit board 10 has a slot 42 which mates with tab 44 on wall 32 of enclosure 28 when board 10 is interfitted with enclosure 28 (FIG. 2). Board 10 is supported on ledges 46 and 48 which project inwardly, respectively, from walls 34 and 38 of enclosure 28 (FIGS. 3, 4 and 5).

Figure 5:
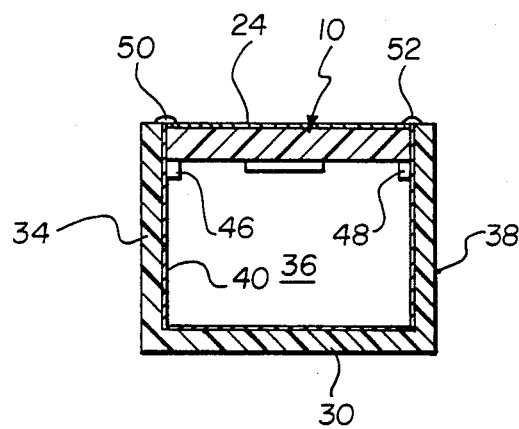
FIG. 5 is a partially sectional, elevational view taken along lines 5—5 in FIG. 2.

As shown in FIGS. 2 and 5, the ground plane layer 24 of board 10 is electrically connected to conductive layer 40 of enclosure 28, such as by solder joints 50 and 52. It will be understood that the solder joints may extend all the way around the adjoining edges of board 10 and enclosure 28. To improve the electrical connection between layers 24 and 40, layer 40 preferably extends to the top of walls 32, 34, 36 and 38. Thus, a portion of layer 40 is adjacent to layer 24 of circuit board 10.

Electrical conductors 16 and 18 of electrical circuit 14 extend beyond slot 42 (See FIG. 1) in order to provide external electrical connection to electrical circuit 14.

Although a particular embodiment of the present invention has been described above and shown in the drawings, it will be understood that modifications and variations thereof evident to those skilled in the art are also deemed to be within the scope of the present invention. Thus, the configuration of the circuit board and enclosure may be other than rectangular. For example, the circuit board may be circular in shape joined with a cylindrical enclosure. It will also be understood that, although electrical connections to the electrical circuit to be shielded are shown as being mounted on an extension of the circuit board, the circuit board may be coextensive with the enclosure. In such case, electrical connections may be made through known connectors which pass through the enclosure.

The invention has been described in detail with particular reference to a preferred embodiment thereof, but it will be understood that variations and modifications can be effected within the spirit and scope of the invention.

What is claimed is:

1. The invention comprising
   a substantially flat, rectangular circuit board having extended upper and lower sides and first, second, third and fourth peripheral edges between said upper and lower sides;
   an electrical circuit which is surface mounted on a predetermined region on one of said upper or lower sides of said circuit board;
   an electrically conductive ground layer provided on the other side of said circuit board, said ground layer being at least coextensive with said predetermined region of said one side of said board and extending to the peripheral edges of said board;
   an open-sided rectangular enclosure of insulating material having a bottom wall and first, second, third and fourth contiguous side walls connected to said bottom wall, said enclosure having an electrically conductive inner layer covering the inner surfaces of said bottom wall and said first, second, third and fourth side walls of said enclosure;
   means for interfitting said circuit board within said enclosure, so that said predetermined region of said one side of said board, on which said electrical circuit is mounted, is enclosed by said conductive inner layer of said enclosure, and, so that said ground layer on said other side of said board, (1) is adjacent to the conductive inner layer on the inner surfaces of said first, second, third and fourth walls of said enclosure, and, (2) forms an electrically conductive wall closing off said open sided enclosure; and
   electrically conductive means for electrically connecting said ground layer on said circuit board to said conductive inner layer of said enclosure, to provide an effective shield for said electrical circuit on said board.

2. The invention of claim 1 wherein said interfitting means includes ledges which project inwardly from an opposing pair of walls of said side walls of said enclosure, said ledges supporting said circuit board within said enclosure.

* * * * *